United States Patent
Tanaka et al.

(10) Patent No.: US 8,952,445 B2
(45) Date of Patent: Feb. 10, 2015

(54) NONVOLATILE SEMICONDUCTOR MEMORY DEVICE

(75) Inventors: Masayuki Tanaka, Yokohama (JP); Kazuhiro Matsuo, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 13/601,372

(22) Filed: Aug. 31, 2012

(65) Prior Publication Data

US 2013/0240978 A1 Sep. 19, 2013

(30) Foreign Application Priority Data

Mar. 16, 2012 (JP) ................. 2012-060905

(51) Int. Cl.
- *H01L 29/792* (2006.01)
- *H01L 21/28* (2006.01)
- *H01L 27/115* (2006.01)

(52) U.S. Cl.
CPC ........ *H01L 29/792* (2013.01); *H01L 21/28273* (2013.01); *H01L 27/11521* (2013.01)
USPC ...................................................... 257/326

(58) Field of Classification Search
USPC ........................................................ 257/326
See application file for complete search history.

(56) References Cited

U.S. PATENT DOCUMENTS

| 8,008,707 B2 | 8/2011 | Matsuo et al. |
| 2007/0205458 A1 | 9/2007 | Yamamoto et al. |
| 2008/0012061 A1* | 1/2008 | Ichige et al. ................. 257/315 |
| 2008/0121978 A1* | 5/2008 | Sawamura ................... 257/321 |
| 2009/0078984 A1 | 3/2009 | Nagano et al. |
| 2009/0152618 A1 | 6/2009 | Matsuo et al. |
| 2011/0073935 A1* | 3/2011 | Sekihara et al. ............. 257/325 |
| 2011/0298039 A1 | 12/2011 | Matsuo et al. |

FOREIGN PATENT DOCUMENTS

| JP | 2007-234959 A | 9/2007 |
| JP | 2009-76635 A | 4/2009 |
| JP | 2009-147135 A | 7/2009 |
| JP | 2009-170719 A | 7/2009 |

* cited by examiner

*Primary Examiner* — Matthew W Such
*Assistant Examiner* — Robert Carpenter
(74) *Attorney, Agent, or Firm* — Oblon, Spivak, McClelland, Maier & Neustadt, L.L.P.

(57) ABSTRACT

According to one embodiment, a nonvolatile semiconductor memory device has a semiconductor substrate, a first insulating film formed on the semiconductor substrate, a charge storage film formed on the first insulating film, a second insulating film formed on the charge storage film, and a control electrode formed on the second insulating film. In the nonvolatile semiconductor memory device, the second insulating film has a laminated structure that has a first silicon oxide film, a first silicon nitride film, and a second silicon oxide film, a first atom is provided at an interface between the first silicon oxide film and the first silicon nitride film, and/or at an interface between the second silicon oxide film and the first silicon nitride film, and the first atom is selected from the group consisting of aluminum, boron, and alkaline earth metals.

15 Claims, 11 Drawing Sheets (a)

(b)

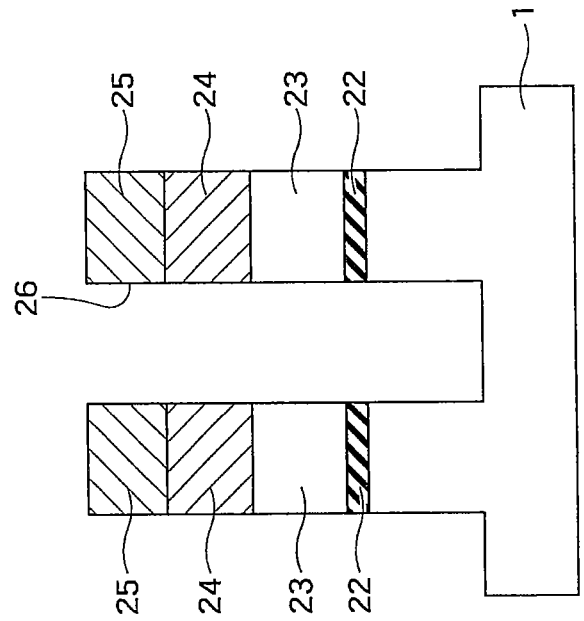
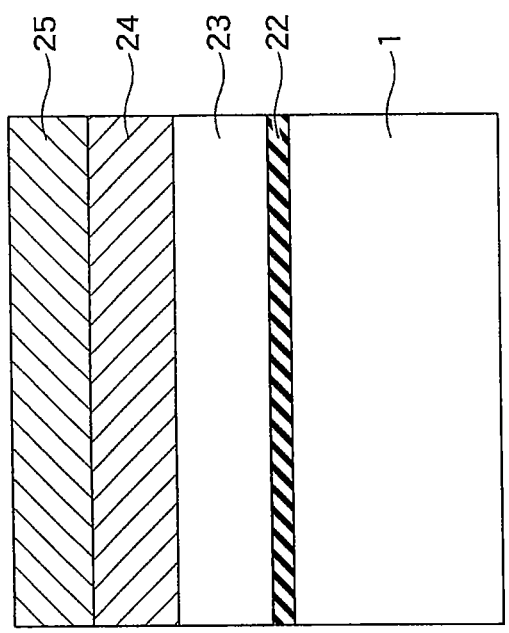
FIG. 3B
FIG. 3A

NONVOLATILE SEMICONDUCTOR MEMORY DEVICE

CROSS REFERENCE TO RELATED APPLICATIONS

This application is based upon and claims the benefit of priority from prior Japanese Patent Application No. 2012-60905, filed on Mar. 16, 2012, the entire contents of which are incorporated herein by reference.

FIELD

Embodiments of the present invention relate to a nonvolatile semiconductor memory device.

BACKGROUND

In a nonvolatile semiconductor memory device of a floating gate type, as an interpoly dielectric (IPD) for electrically insulating a floating gate (FG) electrode and a control gate (CG) electrode from each other, use is made of an ONO film having a laminated structure composed of three films of a silicon oxide film, a silicon nitride film and a silicon oxide film.

The silicon nitride film in this ONO film does not have a completely stoichiometric composition because of a forming method thereof, and has a composition in which silicon atoms are slightly excessive (in proportion by mole). In such a silicon nitride film, wherein silicon atoms are excessive, a level at which electric charges are trapped exists. Thus, when an electric field is applied to the nonvolatile semiconductor memory device, that is, a data is written or erased in the nonvolatile semiconductor memory device, the level, in the silicon nitride film, traps a part of leak charges from the FG electrode. Moreover, the barrier height of the silicon nitride film is lower than that of the silicon oxide films; therefore, the charges trapped in the silicon nitride film do not easily undergo a detrap (leak) to the outside of the ONO film because of both of the trap level of the silicon nitride film and the barrier height of the silicon oxide films formed to sandwich the silicon nitride film. Thus, the charges trapped in the silicon nitride film make the self-electric-field of the silicon nitride film high. This matter causes a rise in the barrier height of the interface between the FG electrode, and the IPD film, which is the ONO film. As a result, the leak current of the IPD film can be decreased.

Nonvolatile semiconductor memory devices are each desired to be further shrunken. As the shrinkage is advancing, the number of charges stored in the FG electrode in the nonvolatile semiconductor memory device is becoming smaller. Thus, in a case where charges trapped in the silicon nitride film of its ONO film when a data is written or erased are detrapped toward the FG electrode when the charges are retained, an effect given to the charge-retention characteristic of the nonvolatile semiconductor memory device by the detrap is never small. Accordingly, in the light of a tendency that the shrinkage of nonvolatile semiconductor memory devices causes a deterioration in their charge-retention characteristic, it is further required to avoid the matter that the charges trapped in the silicon nitride film of the ONO film are detrapped when the charges are retained.

Furthermore, for nonvolatile semiconductor memory devices, required are not only the shrinkage thereof but also a matter that their ONO film, as their IPD film, is made thinner in order to avoid an increase in interference between their semiconductor memory elements by the shrinkage. However, as the ONO film is made thinner, the leak current is further increased. It is therefore difficult to make the ONO film thinner while the leak current is restrained.

BRIEF DESCRIPTION OF THE DRAWINGS

FIG. 3A to FIG. 3J are each a view referred to for describing a process for producing the nonvolatile semiconductor memory device according to the first embodiment;

DETAILED DESCRIPTION

In one embodiment, a nonvolatile semiconductor memory device includes: a semiconductor substrate; a first insulating film formed on the semiconductor substrate; a charge storage film formed on the first insulating film; a second insulating film formed on the charge storage film; and a control electrode formed on the second insulating film. In the nonvolatile semiconductor memory device, the second insulating film has a laminated structure having a first silicon oxide film, a first silicon nitride film, and a second silicon oxide film, and a first atom is provided at an interface between the first silicon oxide film and the first silicon nitride film, and/or at an interface between the second silicon oxide film and the first silicon nitride film, the first atom being selected from the group consisting of aluminum, boron, and alkaline earth metals.

Hereinafter, embodiments of the invention will be described with reference to the drawings. However, the invention is not limited to the embodiments. To any member or portion common to all the figures is attached a common reference number. Overlapped description thereof is omitted. The figures are each a schematic view to promote the explanation of the invention and the outstanding thereof, and any shape, dimension, ratio or other factor shown in the figure may be different from that about an actual subject (such as an actual device) of the subject shown by the figure. However, such a factor may be appropriately changed or modified, from the viewpoint of design, with reference to the following description and any known technique.

First Embodiment

Figure 1:
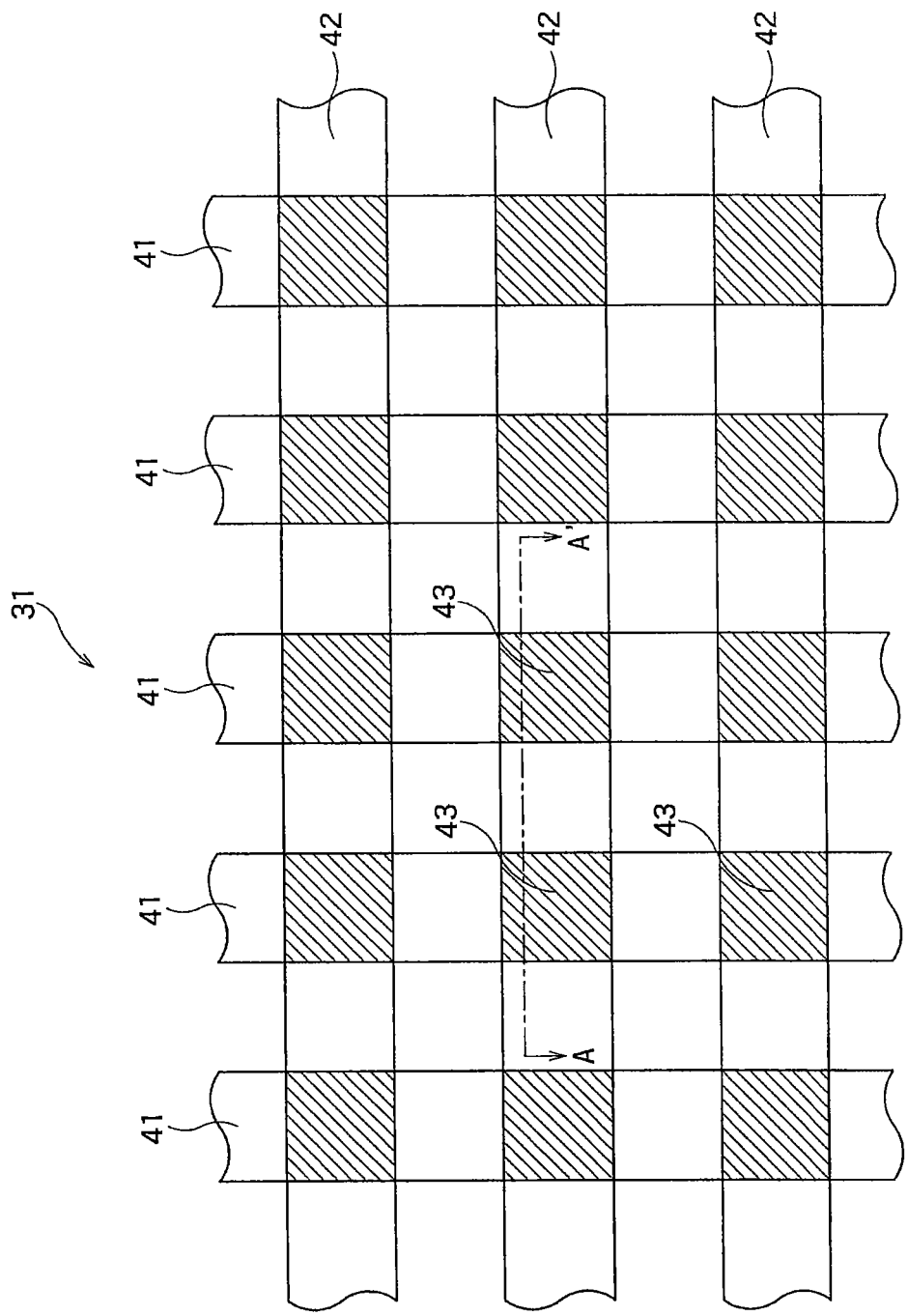
FIG. 1 is a plan view of a nonvolatile semiconductor memory device according to each of first and second embodiments of the invention.
Figure 2:
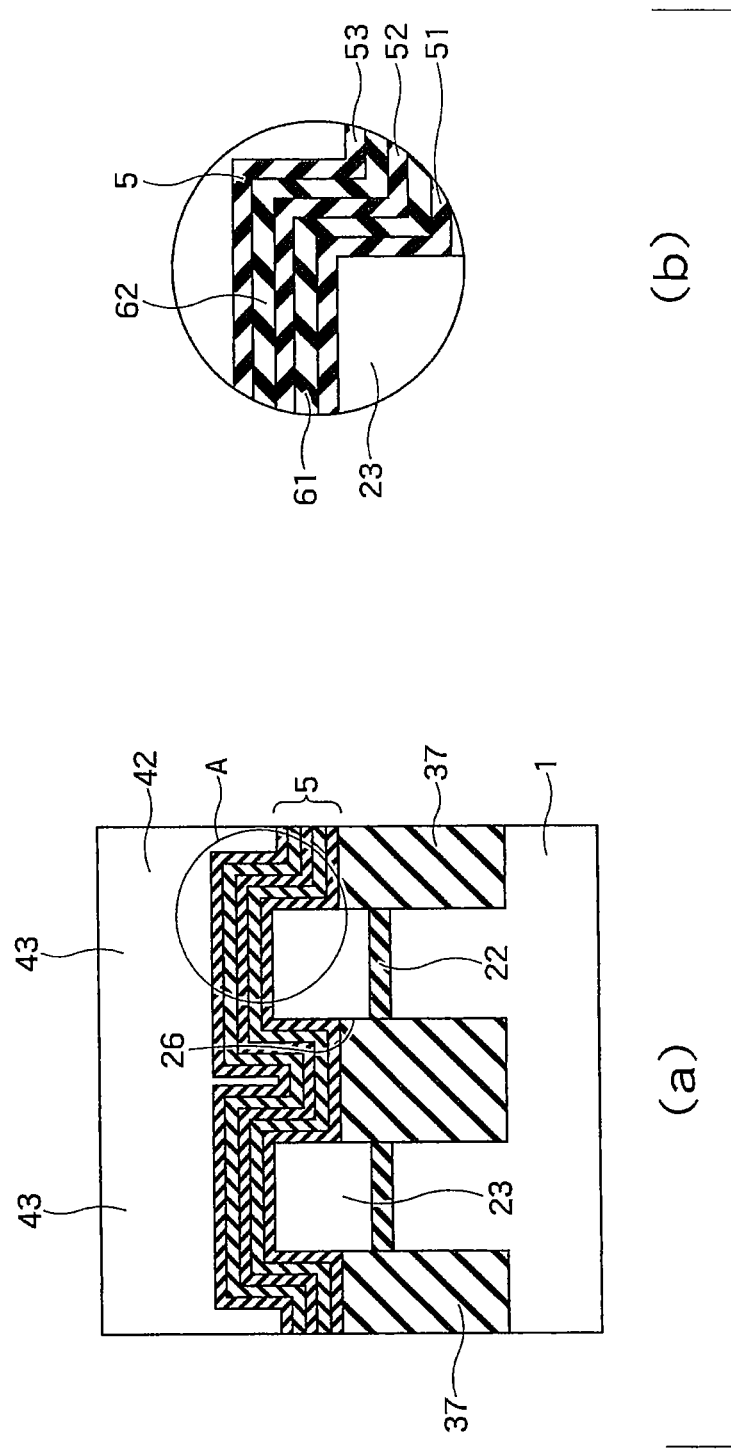
FIG. 2 is a view illustrating a cross section of the nonvolatile semiconductor memory device according to the first embodiment, and an enlarged portion thereof together.

With reference to FIGS. 1 and 2, a description will be made about an FG gate type semiconductor memory device (nonvolatile semiconductor memory device) 31. The description will be made, giving, as an example, a case where the invention is applied to an IPD film (second insulating film) 5 in the semiconductor memory device 31. However, the invention is not limited to this example. Thus, the invention is applicable to any other semiconductor device or some other device, or a moiety thereof.

FIG. 1 is a plan view of the semiconductor memory device 31 of the present embodiment. A plan view of a memory cell region of a semiconductor memory device of a second embodiment, which will be described later, is identical to FIG. 1.

As illustrated in FIG. 1, in the semiconductor memory device 31 of the present embodiment, plural bit lines 41 are formed along the top and bottom direction of the paper on which FIG. 1 is drawn. The bit lines 41 are arranged in the transverse direction of the paper at regular intervals to be parallel to each other. Plural word lines (CG electrodes) 42 are formed perpendicularly to the bit lines 41, as viewed in plan. Furthermore, at plural sites where the individual bit lines 41 cross the individual word lines 42 three-dimensionally, plural memory cell transistors 43 are formed, respectively. In other words, the memory cell transistors 43 are arranged in a matrix form in a memory cell region of the semiconductor memory device 31.

The following will describe the semiconductor memory device 31 according to the embodiment, referring to FIG. 2. A part (a) of the figure is a sectional view of the memory cell region of the semiconductor memory device 31. Specifically, the part (a) is a sectional view of the semiconductor memory device 31 that is obtained by cutting the device 31 along line A-A' line in FIG. 1. A part (b) thereof is a view obtained by enlarging a region A surrounded by a circle in the part (a).

As illustrated in the part (a) of FIG. 2, the semiconductor memory device 31 of the embodiment specifically has a semiconductor substrate 1, and the memory cell transistors 43 formed on the semiconductor substrate 1. The memory cell transistors 43 are each made of a laminate composed of a gate insulating film (first insulating film) 22 and an FG electrode (charge storage film) 23. The individual memory cell transistors 43 are isolated from each other through an element isolation trench 26 made in the semiconductor substrate 1. An element isolation insulating film 37 that is a silicon oxide film formed by a painting method is buried in the element isolation trench 26. An IPD film (second insulating film) 5 is formed to cover the upper surfaces of the memory cells 43 and the upper surface of the element isolation insulating film 37. The CG electrodes (control electrodes) 42 are formed thereon.

As illustrated in the part (b) of FIG. 2, the IPD film 5 more specifically has a laminated structure composed of a silicon oxide film 51, a silicon nitride film 52 and a silicon oxide film 53 (ONO film). The above three films 51, 52, 53 have films 61 and 62 containing aluminum atoms in their respective interfaces. It is preferred that in the interface between the silicon oxide film 51 and the aluminum-atom-containing film 61, the silicon-oxide-film-contacting surface of this film 61 is in a state of being higher in oxygen density than the silicon oxide film 51; the same matter is applied to the film 62 and the film 53.

Accordingly, instead of the aluminum-atom-containing films 61 and 62, use may be made of films each containing atoms that is other than the aluminum atoms and do not easily generate oxygen deficiency by an appropriate treatment. Examples of the atoms include non-transition metal atoms, and preferred examples thereof include boron atoms, and alkaline earth metal atoms such as beryllium, magnesium, calcium, strontium, and barium.

In the embodiment, the description has been made on the premise that the aluminum-atom-containing films 61 and 62 are each a film. However, the aluminum-atom-containing films 61 and 62 in the embodiment are each not limited into any film form. It is allowable to use, instead of the film-form aluminum-atom-containing films 61 and 62, the following form: a form that aluminum atoms or different-species atoms are present in each of the interfaces of the laminated structure, that is, the IPD film 5, composed of the silicon oxide film 51, the silicon nitride film 52 and the silicon oxide film 53.

The aluminum-atom-containing films 61 and 62 may each be in any film state, such as in the state of a film of any one of an oxide, a nitride, a boride, a sulfide and others, or in the state of a film of a mixture of two or more thereof. When these films are each rendered an oxide, nitride, boride, or sulfide film, a treatment as will be described later is conducted. When the aluminum-atom-containing films 61 and 62 are each formed as a metal, nitride, boride, or sulfide film, in a subsequent step the surfaces of the aluminum-atom-containing films 61 and 62 may be oxidized since the aluminum atoms or different-species atoms are easily oxidizable. The following description will be made, giving, as an example, a case where aluminum oxide films are used as the aluminum-atom-containing films 61 and 62.

The concentration of the aluminum atoms or different-species atoms that are contained in the aluminum-atom-containing films 61 and 62 is preferably adjusted to set the surface density thereof into the value of not less than 1e12 atoms/cm$^2$ and not more than 1e16 atoms/cm$^2$, details of which are to be described later. For example, when the aluminum-atom-containing films 61 and 62 are each an aluminum oxide film and the concentration of the aluminum atoms therein is desired to be a value of not less than 1e12 atoms/cm$^2$ and not more than 1e16 atoms/cm$^2$, the film thickness of each of the aluminum-atom-containing films 61 and 62 is not less than 0.001 nm and not more than 1 nm.

The following will describe a process for producing the semiconductor memory device 31 of the embodiment with reference to FIG. 3A to FIG. 33. FIG. 3A to FIG. 33 are each a view of a cross section of the memory cell region of the semiconductor memory device in one out of individual steps of this process. These cross-sectional views each correspond specifically to the cross section of the semiconductor memory device 31 in the part (a) of FIG. 2.

First, a well-known method is used to form a first insulating film 22 that is, for example, a silicon oxide film into a film thickness of, for example, about 1 to 15 nm onto a semiconductor substrate (p-type silicon substrate, or an n-type silicon substrate wherein p-type wells are formed) 1. A chemical vapor deposition (CVD) method is used to form thereonto an FG electrode 23 that is, for example, a polysilicon film, into a film thickness of about 10 to 50 nm. Subsequently, a CVD method is used to form a first mask material 24 that is, for example, a silicon nitride film into a film thickness of, for example, about 50 to 200 nm. Furthermore, a CVD method is used to form a second mask material 25 that is, for example, a silicon oxide film into a film thickness of, for example, about 50 to 400 nm. In this way, a structure illustrated in FIG. 3A can be yielded.

Next, a photoresist (not illustrated) is painted on the second mask material 25, and then the photoresist is patterned by the radiation of light into a pattern form. The photoresist is used as an etching-resistant mask to etch the second mask material 25. In this way, the second mask material 25 is patterned. Furthermore, the photoresist is removed, and the patterned second mask material 25 is used as a mask to etch the first mask material 24, the FG electrode 23, the gate insulating film 22 and the semiconductor substrate 1, thereby making an element isolation trench 26. In this way, a structure illustrated in FIG. 3B is yielded.

Figure 3C:
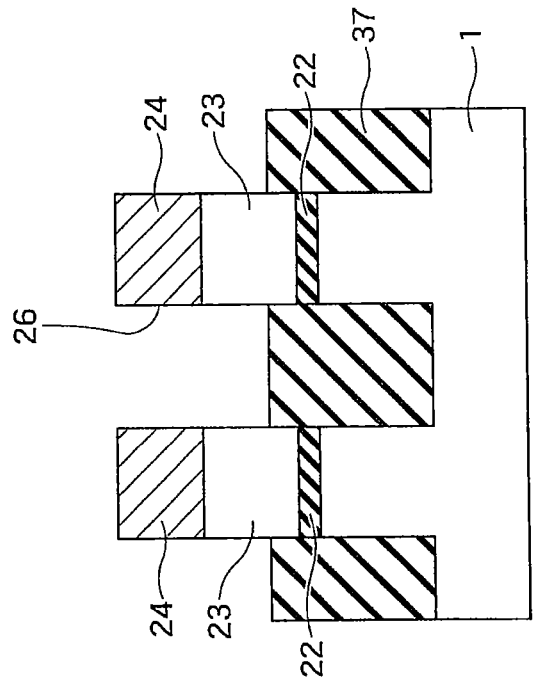
Figure 3D:
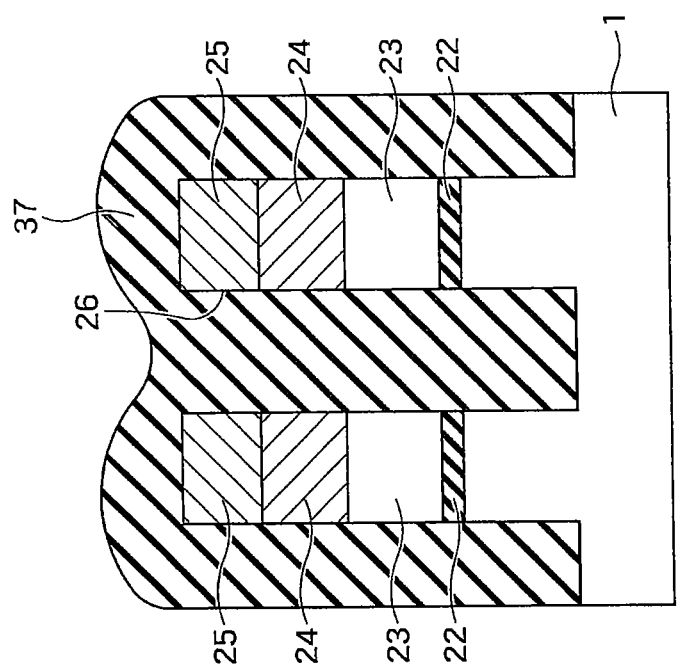
Figure 3E:
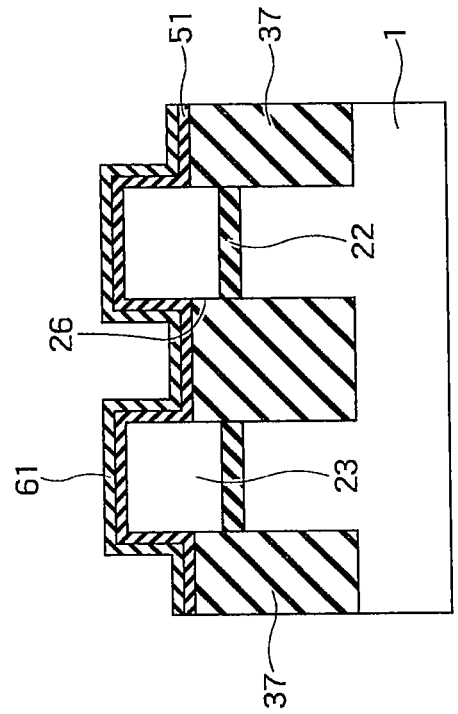
Figure 3F:
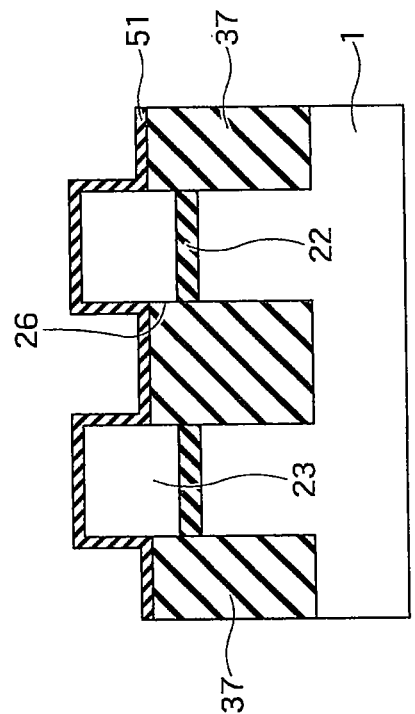
Figure 3G:
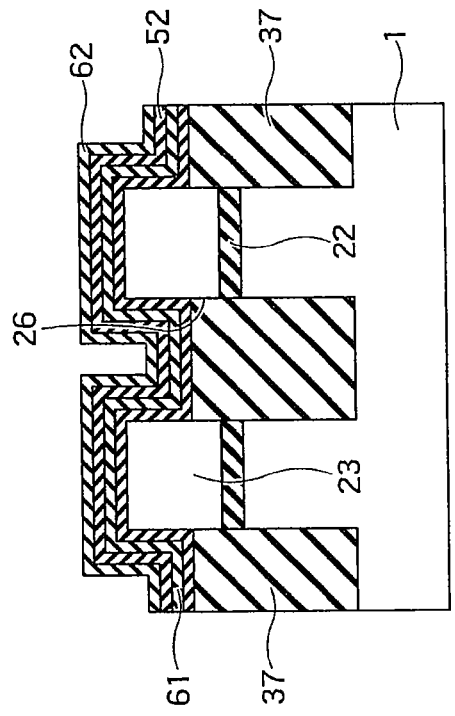

A well-known method, such as a painting method, is then used to bury an element isolation insulating film 37 having a thickness of, for example, 200 to 1500 nm into the element isolation trench 26, which is made in the silicon oxide film. In this way, a structure illustrated in FIG. 3C is yielded.

Next, the workpiece is subjected to treatment with an oxygen atmosphere or a water vapor atmosphere to make the element isolation insulating film 37 highly dense. Next, the second mask material 25 is removed, and then a chemical mechanical polishing (CMP) method is used to make the element isolation insulating film 37 flat, using the first mask material 24, which is the silicon nitride film, as a stopper. Next, the upper surface of the element isolation insulating film 37, which is the silicon oxide film, is etched back under etching conditions that the etch selection ratio of the silicon oxide film to the silicon nitride film is appropriate. In this way, a structure illustrated in FIG. 3D can be yielded.

Furthermore, a low-pressure chemical vapor deposition (LP-CVD) method is used to cause dichlorosilane to react with nitrogen suboxide ($N_2O$) at a temperature of about 800° C. to form a silicon oxide film 51 having a film thickness of, for example, about 1 to 10 nm. In this way, a structure illustrated in FIG. 3E can be yielded. The method for forming the silicon oxide film 51 is not limited to such an LP-CVD method. Thus, various well-known methods may be used.

An aluminum-atom-containing film 61 (hereinafter referred to as the aluminum oxide film) is then formed. In this way, a structure illustrated in FIG. 3F can be yielded.

The aluminum oxide film 61 is formed to make the silicon-oxide-film-contacting surface of this film 61 higher in oxygen density than the silicon oxide film 51. Specifically, the aluminum oxide film 61 is formed preferably to adjust the concentration of the aluminum atoms in this film 61 into the value of not less than 1e12 atoms/$cm^2$ and not more than 1e16 atoms/$cm^2$. As described above, this matter corresponds to the matter that the film thickness of the aluminum oxide film 61 is from about 0.001 to 1 nm. When the distance between any adjacent two of the memory cell transistors 43 is desired to be made small as the semiconductor memory device 31 is shrunken, it is preferred that the film thickness of the aluminum oxide film 61 to be formed is smaller. If the film thickness of the aluminum oxide film 61 is made large, the electric distance between the memory cell transistors 43 is unfavorably reduced.

As the method for forming the aluminum oxide film 61, various methods may be used. Examples thereof include an atomic layer deposition (ALD) method of depositing the unit of an atomic monolayer repeatedly by repeating the following sequence plural times: a sequence of introducing an aluminum source into a furnace having a reduced pressure, degassing the furnace into a vacuum, purging the inside of the furnace with an inert gas, supplying oxidizer, degassing the furnace into a vacuum, purging the inside of the furnace with an inert gas, and again introducing an aluminum source thereinto; CVD methods; physical vapor deposition (PVD) methods of adsorbing excited atoms in a physical manner; painting methods of painting a solution containing atoms onto the semiconductor substrate 1; and dipping methods of dipping the semiconductor substrate 1 into a solution containing desired atoms. The formation of the aluminum oxide film 61 is performed preferably under conditions permitting this film 61 to be formed as a thin film. For example, the formation is performed preferably at a film-depositing temperature of room temperature to about 500° C. The reaction for the surface adsorption of the aluminum atoms or different-species atoms is a competition reaction between the adsorption of the atoms and the elimination thereof; thus, if the temperature is too high, the atom elimination becomes dominative so that the atoms are not easily adsorbed to give a desired concentration. Furthermore, there are caused problems such that the aluminum source is decomposed, and CVD reaction is caused so that the in-plane adsorption quantity is deteriorated in evenness. On the other hand, if the temperature is too low, for example, a reaction of the oxidizer with the aluminum source becomes weak so that organic groups in the aluminum source remain in a large quantity. This matter results in the formation of defects to cause finally a problem that the aluminum oxide film 61 is not obtained with desired electric properties. It is therefore preferred in the formation of the aluminum oxide film 61 that the film-depositing temperature is optimized to form this film 61 as a desired film.

More specifically, the formation of the aluminum oxide film 61 can be attained by introducing trimethylaluminum (TMA) into a furnace at a film-depositing temperature of 300° C. and performing an ALD method using, as an oxidizer, for example, water, oxygen, ozone, nitrogen suboxide, or radical oxygen excited in a physical manner.

When an aluminum nitride film is desired to be formed instead of the aluminum oxide film 61, it is advisable to introduce, into the furnace, a nitriding agent instead of the oxidizer. The nitriding agent may be, for example, ammonia, hydrazine, or radical nitrogen excited in a physical manner. Similarly, when an aluminum boride film is desired to be formed, it is advisable to use, as a boriding agent, a boron compound such as diborane or boron chloride. When an aluminum sulfide film is desired to be formed, it is advisable to use, as a sulfurizing agent, hydrogen sulfide, or some other.

When a metal film, a nitride film, a boride film or a sulfide film of aluminum is formed instead of the aluminum oxide film 61, the front surface is to be oxidized in a subsequent step since aluminum atoms are easily oxidizable.

The source of aluminum may be, besides TMA, any other alkyl aluminum, wherein an alkyl group other than the group of methyl is bonded to an aluminum element; an amino material wherein an amino group is bonded to an aluminum element; an aluminum halide; or some other material. When a film containing desired atoms other than the atoms of aluminum is formed instead of the aluminum oxide film 61, various materials each containing the desired atoms may be used as a source therefor.

Next, a silicon nitride film 52 is formed into a film thickness of, for example, about 1 to 5 nm onto the aluminum oxide film 61. In this way, a structure illustrated in FIG. 3G can be yielded. As the method for forming the silicon nitride film 52, various methods may be used. An example thereof is a radical nitriding method as will be specifically described just below. Other examples thereof include an ALD method, an LP-CVD method, a plasma CVD method, PVD methods such as a sputtering method, and a thermal nitriding method using an ordinary electric furnace.

The radical nitriding method, which has been given as one example of the silicon-nitride-film-52-forming method, is a method of using, as a nitriding species, nitrogen excited physically by, for example, plasma and treating the front surface with the nitrogen species to be nitrided. In this method, the nitrided quantity of the surface depends on conditions for the treatment; thus, the nitrided quantity can be adjusted at will. Moreover, a lowering in the treating temperature, a decrease in the treating period, and others can be attained, and further a thin film can be formed with a good controllability since the treatment causes not any deposition but the nitriding of the front surface.

In this method, more specifically, microwaves having an intensity of 100 to 3000 W are generated in an atmosphere containing nitrogen gas under conditions that the treating pressure is set into the range of 5 to 30 Pa and the substrate temperature, into that of 350 to 900° C., thereby making it possible to generate nitrogen radicals. With the generated nitrogen radicals, the aluminum oxide film 61 is treated to form a silicon nitride film 52 thereon. The aluminum oxide film 61 is very thin (for example, a thickness corresponding substantially to a monoatomic layer), so that the silicon oxide film 51 is partially bare. When this surface is subjected to the radical nitriding method, aluminum atoms in the aluminum oxide film 61 are pushed toward the silicon oxide film 51 while the silicon nitride film 52 is formed in the vicinity of the front surface of the aluminum oxide film 61. Accordingly, when the radical nitriding method is used, the aluminum oxide film 61 may be intermingled with the silicon nitride film 52 to make the interface between the aluminum oxide film 61 and the silicon nitride film 52 indefinite.

Figure 3H:
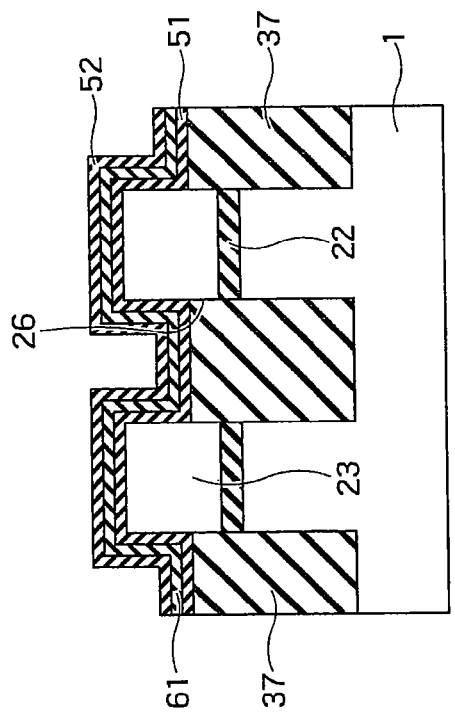

In the same way as used to form the aluminum oxide film 61, an aluminum oxide film 62 is formed onto the silicon nitride film 52 to yield a structure illustrated in FIG. 3H.

Figure 3J:
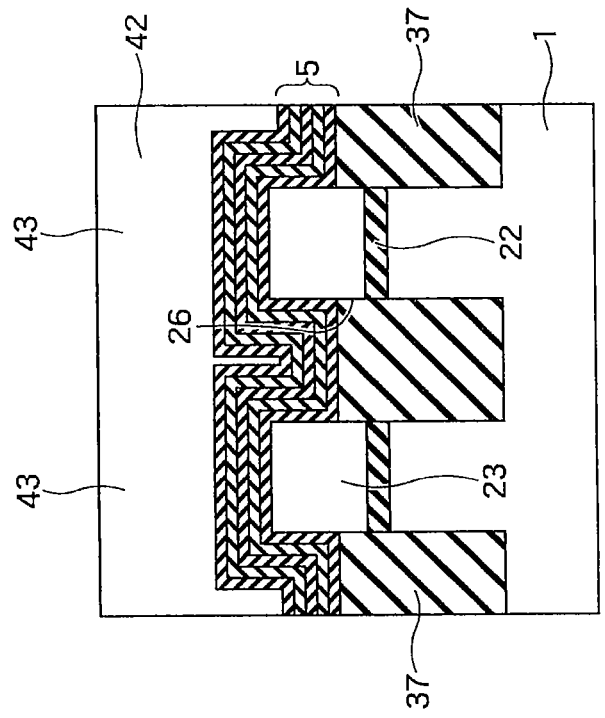
Figure 3I:
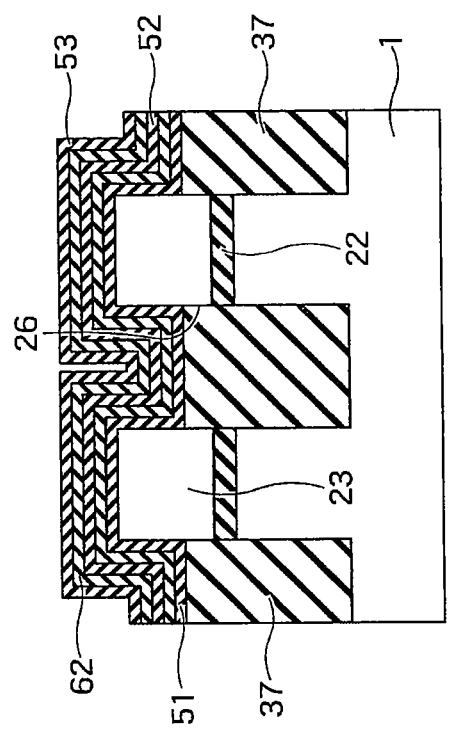

Next, in the same way as used to form the silicon oxide film 51, a silicon oxide film 53 is formed onto the aluminum oxide film 62 to yield a structure illustrated in FIG. 3I. At this stage, it is allowable to conduct densifying treatment (heat treatment) for making the individual films highly dense and improving the interfaces; oxidizing treatment for oxygen compensation or improving the interfaces; and/or other treatments.

CG electrodes 42 are formed onto the silicon oxide film 62 to succeed in yielding a structure illustrated in FIG. 3J. The CG electrodes 42 are patterned by the radiation of light into a pattern form, and then the workpiece is subjected to well-known steps. In this way, the semiconductor memory device 31 can be yielded.

According to the embodiment, the IPD film 5 of the laminated structure of the silicon oxide film 51/the silicon nitride film 52/the silicon oxide film 53 (ONO film) has, at the interfaces thereof, the aluminum oxide films 61 and 62, respectively, thereby restraining a deterioration in the charge-retention characteristic to make it possible to give the semiconductor memory device 31 with excellent device characteristics and reliability. Details thereof will be described below.

As described above, by use of an ONO film as an IPD film in a conventional semiconductor memory device, charges are trapped in the silicon nitride film in the ONO film so that the leak current of the IPD film is decreased. However, as semiconductor memory devices are further shrunken and additionally their IPD film is made thinner, the quantity of charges trapped in the silicon nitride film therein is decreased and additionally the once-trapped charges are easily detrapped at the time of the charge-retention of the semiconductor memory devices. This matter causes deterioration in the charge-retention characteristic of the semiconductor memory devices.

However, in the semiconductor memory device 31 of the embodiment, the IPD film 5, which is the ONO film, has at the interfaces thereof the aluminum oxide films 61 and 62, respectively. These films make it possible that charges are caused to remain in the silicon nitride film 52 in the ONO film even at the time of the charge-retention of the semiconductor memory device 31. This matter makes it possible to restrain a charge-retention characteristic deterioration based on the detrap of the charges in the silicon nitride film 52.

Furthermore, even when a data is written into the semiconductor memory device 31, the presence of the aluminum oxide film 62 at the CG electrode 42 side of the device makes it difficult that charges trapped in the silicon nitride film 52 are detrapped to the CG electrode 42 side. Accordingly, the charges can be caused to remain in the silicon nitride film 52. Thus, the effect of the charges remaining in the silicon nitride film 52 makes it difficult that charges in the FG electrode 23 are detrapped to the CG electrode 42 side, so that the charges remain easily in the FG electrode 23. As a result, the data is easily written.

In the meantime, when the data is erased in the semiconductor memory device 31, the presence of the aluminum oxide film 61 at the FG electrode 23 side of the device makes it difficult that charges trapped in the silicon nitride film 52 are detrapped to the FG electrode 23 side. Accordingly, only the charges in the FG electrode 23 need merely to be erased. As a result, the charges in the FG electrode 23 can easily be erased.

In other words, the embodiment makes it possible to make better the writing/erasing properties of the semiconductor memory device 31. The reason why the detrap of charges can be prevented in this way in the embodiment would be that the formation of the aluminum oxide films 61 and 62 modulates/increases the barrier height of the silicon oxide films 51 and 53. The following will describe details thereof, giving, as an example, a case where the aluminum oxide films 61 and 62 are formed.

When an aluminum oxide film and a silicon oxide film are laminated onto each other, in other words, different oxide films are laminated onto each other, different oxygen densities are generated in the vicinity of the interface. Oxygen ions are shifted to a lower oxygen concentration side of the two films so as to relieve the oxygen density difference in the vicinity of the interface. Specifically, in the aluminum oxide film and the silicon oxide film, the oxygen density in the aluminum oxide film is higher. Accordingly, in the vicinity of the interface between the aluminum oxide film and the silicon oxide film, oxygen ions in the aluminum oxide film are shifted toward the silicon oxide film. It can be considered that when the aluminum oxide film is made thin, the oxygen ions are easily shifted since bonds in the film are weak. When the oxygen ions are shifted in this way, an electric dipole is generated at the interface based on the different oxide film. Furthermore, the electric dipole modulates the energy band structure of the oxide films. Detailedly, when the electric dipole is generated to arrange positive charges at the charge-injection side oxide film and arrange negative charges at the oxide film positioned at the side opposite to the charge-injection side, the energy band is modulated to increase the barrier against the charges. In other words, the energy band is modulated to make the barrier height (electron barrier) of the silicon oxide film higher. Thus, the probability of the tunneling of the charges is decreased so that the detrap of the charges is reduced. For reference, the inventors have verified according to photoelectron spectroscopy that when an aluminum oxide film is formed on a semiconductor substrate and then a silicon oxide film is formed thereon, the barrier height is from about 0.2 to 0.5 eV higher than when a silicon oxide film is directly formed on a semiconductor substrate.

In order to verify that the formation of the aluminum oxide films 61 and 62 causes a reduction in the probability of the tunneling of charges (electrons), that is, a leak current in the embodiment, the inventors formed a sample wherein a silicon oxide film was formed on a silicon nitride film (comparative sample), and a sample wherein an aluminum oxide film was formed at the interface of a sample equivalent to the comparative sample (embodiment sample); and then examined about how the leak current property of each of the samples changed. Results obtained in this way are shown in FIG. 4, which shows a relationship between the applied electric field and the leak current density.

Figure 4:
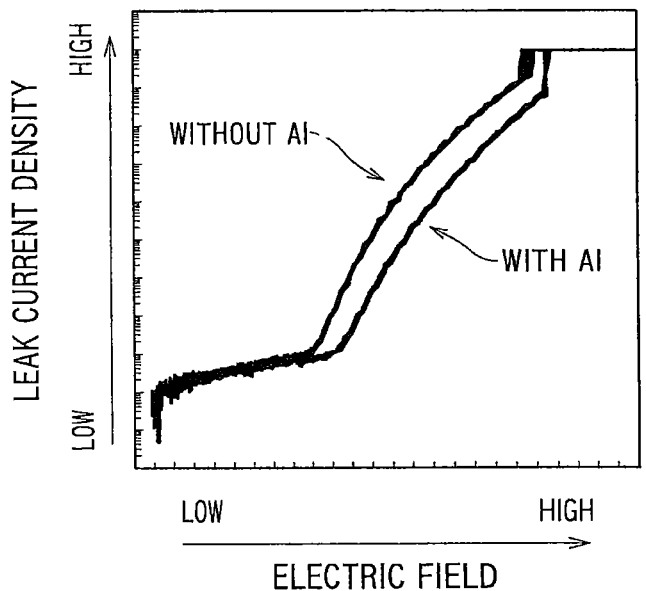
FIG. 4 to FIG. 6 are each a graph referred to for describing the embodiment of the invention.

Specifically, the comparative sample in FIG. 4 was an MIS capacitor obtained by forming a silicon nitride film and a silicon oxide film onto a silicon substrate, and the embodiment sample in FIG. 4 was an MIS capacitor obtained by forming an aluminum oxide film between the same silicon nitride film and silicon oxide film as in the comparative sample. Conditions for forming these samples were the same as described above. The concentration of the aluminum atoms therein was adjusted to 1e14 atoms/cm$^2$. Charges (electrons) were injected to each of these samples from the silicon substrate side thereof to the silicon oxide film. The obtained results are shown in FIG. 4. In FIG. 4, its transverse axis represents the applied voltage; and its vertical axis, the leak current density. From FIG. 4, it has been made evident that in the sample of the embodiment, the leak current density was smaller in substantially the whole of its electric field region than that in the comparative sample. It has been therefore made evident that the formation of such an aluminum oxide film reduces the probability of the tunneling of charges (electrons).

Next, in order to verify that when the advantageous effect verified from FIG. 4 is applied to an ONO film as an IPD film, charges in the ONO film come not to be easily detrapped, the inventors formed the following two: a sample having an ONO film (comparative sample); and a sample wherein an aluminum oxide film was formed at the interface between one of the silicon oxide films and the silicon nitride film of a sample equivalent to this comparative sample (embodiment sample). The inventors examined each of these samples about how the leak current property thereof changed. Results obtained in this way are shown in FIG. 5, which shows a relationship between the applied electric field and the leak current density.

Figure 5:
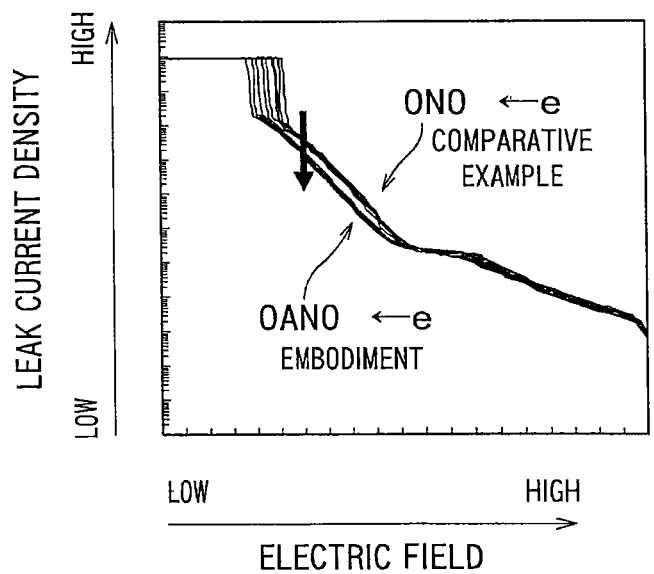

Specifically, the comparative sample in FIG. 5 was an MIS capacitor obtained by forming an ONO film onto a polysilicon substrate, and the embodiment sample in FIG. 5 was an MIS capacitor obtained by forming an aluminum oxide film at the interface between the charge (electron)-injecting-side opposed side silicon oxide film and the silicon nitride film in the same ONO film as in the comparative sample. Conditions for forming these samples were the same as described above. Charges (electrons) were injected to each of these samples from its upper electrode. In this case, a relationship between the applied electric field and the leak current density is shown in FIG. 5. In FIG. 5, its transverse axis represents the applied voltage; and its vertical axis, the leak current density.

From FIG. 5, it has been made evident that in the sample of the embodiment, the leak current density was smaller in substantially the whole of its electric field region than that in the comparative sample. In other words, it has been made evident that by forming such an aluminum oxide film at the interface between the charge (electron)-injecting-side opposed side silicon oxide film and the silicon nitride film in such an ONO film, the leak current is reduced. This result demonstrates that the formation of the aluminum oxide film restrains the detrap of charges trapped in the silicon nitride film, in the ONO film, toward the lower electrode.

Figure 6:
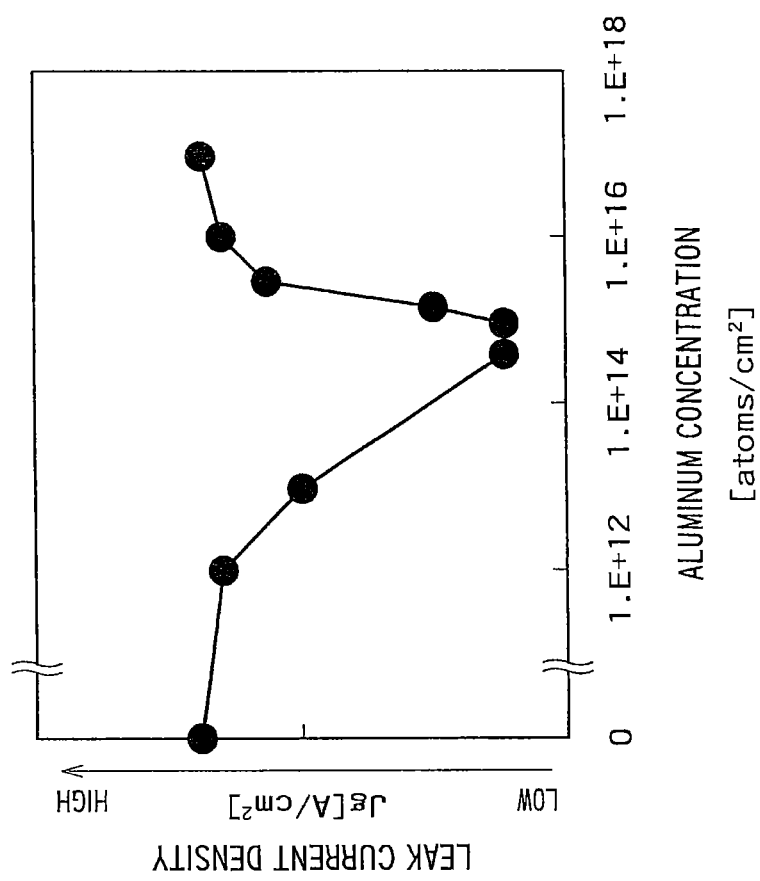

Furthermore, the inventors examined a relationship between the concentration of aluminum atoms in an aluminum oxide film and the leak current. Results obtained in this way are shown in FIG. 6, which is a graph showing the relationship between the concentration of aluminum atoms and the leak current density. Details of the examination are as follows: an aluminum oxide film is formed on a silicon nitride film on each silicon substrate to have a desired aluminum atom concentration, and further a silicon oxide film is formed thereon to yield each sample, which is an MIS capacitor; charges (electrons) were injected to each of these samples from the silicon substrate side thereof; and in this case, a relationship between the aluminum atom concentration and the leak current density is shown in FIG. 6. In FIG. 6, its transverse axis represents the concentration of aluminum atoms; and its vertical axis, the leak current density. A sample wherein no aluminum oxide film was formed was used as a comparative example (aluminum atom density: zero).

According to FIG. 6, the effect of decreasing the leak current was obtained in some samples wherein the aluminum atom concentration was 1e12 cm$^{-2}$ or more, out of all the samples. Therein, the leak current was decreased, as compared with that in the comparative sample. On the other hand, in some samples wherein the aluminum atom concentration was 1e16 cm$^{-2}$ or more, an increase in the leak current was observed. By the inventors' investigations, the best results proved to be obtained in some samples wherein the aluminum atom concentration was close to 1e14 cm$^{-2}$. In order to obtain an advantageous effect of decreasing the leak current, it is presumed that about the aluminum atom concentration, an optimal value exists. It is therefore preferred in the embodiment to optimize the aluminum atom concentration, correspondingly to properties or others required for a semiconductor memory device to be produced.

When metal, nitride, boride, or sulfide films are formed instead of the aluminum oxide films 61 and 62 in the embodiment, in a subsequent step the surfaces thereof are to be oxidized since the atoms of aluminum are easily oxidizable. Thus, interfaces each based on the different oxide films as described above are to be present. Accordingly, an electric dipole is to be generated in each of the interfaces so that the barrier height can be made high. When the metal, nitride, boride, or sulfide films are formed instead of the aluminum oxide films 61 and 62, advantageous effects as will be described in the following can be obtained dependently on the species of the films: when the oxide films are formed, impurities resulting from the aluminum source, and impurities adsorbed on the surfaces can be removed by the oxidizer, so that the oxide films can be formed as good films; when the nitride films are formed, very thin oxide films can be formed at the interfaces so that an electric dipole polarized into a larger degree can be obtained, whereby a higher barrier height can be obtained; when the boride films are formed, an electric dipole polarized into a larger degree can be obtained since an oxide itself of the boron atoms produces an effect onto the polarization of the electric dipole, whereby a higher barrier height can be obtained; or when the sulfide films are formed, films containing aluminum atoms at a lower concentration can easily be formed.

Furthermore, it can be considered that in the case of using, instead of the aluminum atoms, alkaline earth metal atoms, such as beryllium, magnesium, calcium, strontium or barium, a larger-degree electric dipole is generated since an atom smaller in atomic number is higher in oxygen holding density. It is therefore preferred to use atoms smaller in atomic number as atoms to be substituted for the aluminum atoms. It can be considered that the use of boron atoms results in the generation of a larger-degree electric dipole since the boron atoms are smaller in atomic number than the aluminum atoms to have oxygen at a higher density. However, the boron atoms diffuse easily into the silicon oxide film. It is therefore preferred to avoid the diffusion of the boron atoms in order to generate an electric dipole at the interface. Thus, it is preferred, for example, to form a film thereof at a low temperature or use the boron atoms in the state of a nitride film.

As described hereinbefore, in the embodiment, the IPD film made of the ONO film has, at its interfaces, the aluminum oxide films, respectively, so that deterioration in the charge-retention property can be restrained. Furthermore, the writing/erasing properties of the semiconductor memory device can be made better. Accordingly, the semiconductor memory device can be made excellent in device characteristics and reliability.

The above description has been made about a structure as has been illustrated in the part (b) of FIG. 2, wherein the IPD film 5 has the laminated structure composed of the silicon oxide film 51/the silicon nitride film 52/the silicon oxide film 53 (ONO film), and the IPD film 5 has the aluminum oxide films 61 and 62 at its two interfaces, respectively, that is, at the interface between the silicon oxide film 51 and the silicon nitride film 52, and that between the silicon nitride film 52 and the silicon oxide film 53, respectively. However, the embodiment is not limited to this structure. Thus, the embodiment may have a structure having an aluminum oxide film at any one of the interfaces. For example, when the device of the embodiment is desired to be good in writing property, an aluminum oxide film needs only to be formed at the interface on the CG electrode side of the device (the interface between the silicon nitride film 52 and the silicon oxide film 53), as has been described above. When the device is desired to be good in erasing property, an aluminum oxide film needs only to be formed at the interface on the FG electrode side thereof (the interface between the silicon oxide film 51 and the silicon nitride film 52), as has been described above. When the device is desired to be good in the two properties, aluminum oxide films need only to be formed on the CG electrode side interface and the FG electrode side interface, respectively.

Second Embodiment

The present embodiment is different from the first embodiment in that an NONON film is used instead of the ONO film. This NONON film is a film wherein an ONO film is further sandwiched between silicon nitride films, and makes it possible to avoid the generation of a bird's-beak at the interface between an IPD film and an FG electrode.

Figure 7:
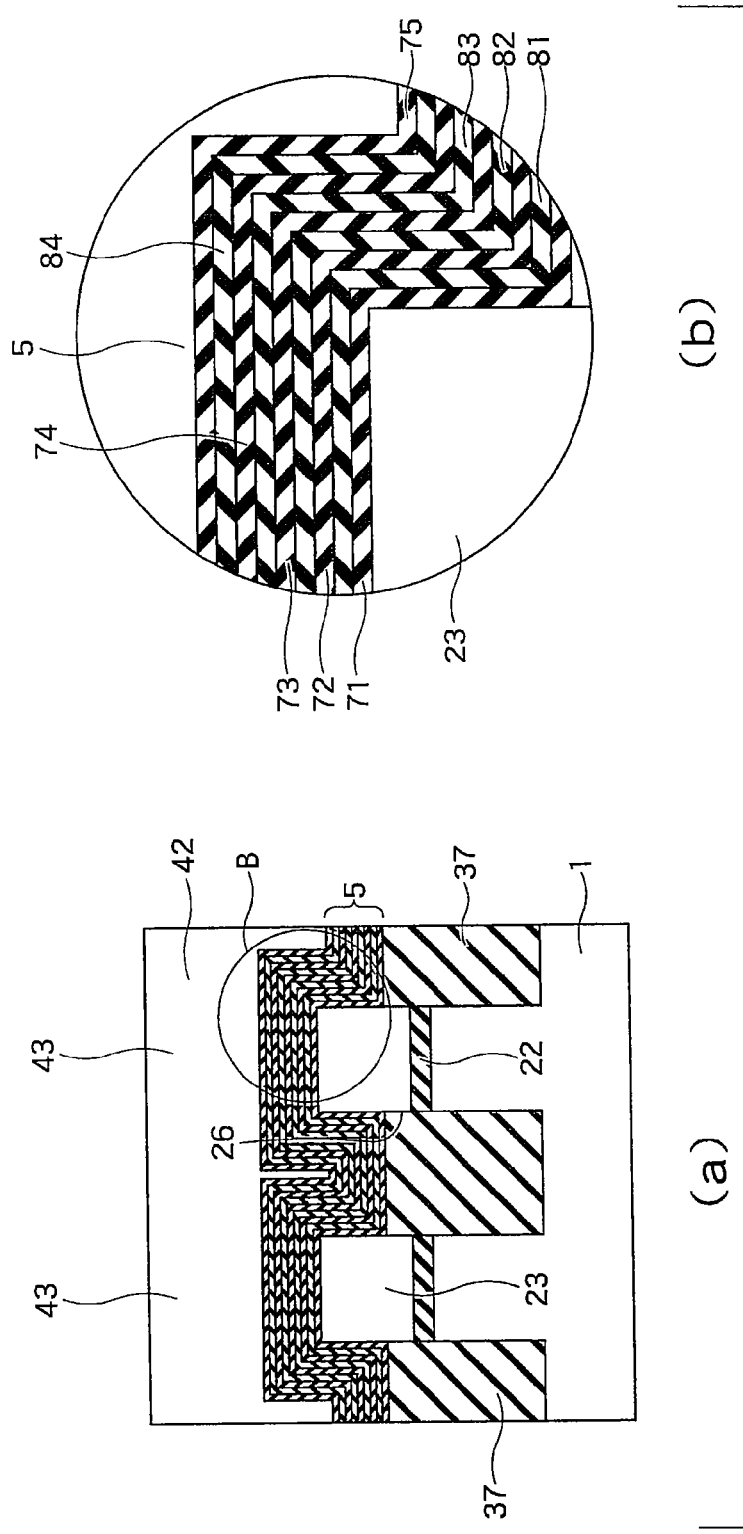
FIG. 7 is a view illustrating a cross section of the nonvolatile semiconductor memory device according to the second embodiment, and an enlarged portion thereof together.

With reference to FIG. 7, a description will be made about an FG gate type semiconductor memory device (nonvolatile semiconductor memory device) 31 of the present embodiment. In the same manner as in the first embodiment, the description will be made, giving, as an example, a case where the invention is applied to an IPD film (second insulating film) 5 in the semiconductor memory device 31. However, the invention is not limited to this case. Thus, the invention is applicable to any other semiconductor device, or some other device, or a moiety thereof. In the following description of the embodiment, to any member or portion that has the same structure and function as the member or portion in the first embodiment is given the same reference number as in the first embodiment, and description thereof is omitted. A part (a) of FIG. 7 is a sectional view of a memory cell region of the semiconductor memory device 31, specifically, a sectional view of the semiconductor memory device 31 obtained by cutting this device along line A-A' in FIG. 1, and a part (b) of FIG. 7 is an enlarged view of a region B surrounded with a circle in the part (a) of FIG. 7.

In the same manner as in the case of the first embodiment, as illustrated in the part (a) of FIG. 7, the semiconductor memory device of the present embodiment specifically has a semiconductor substrate 1, and memory cell transistors 43 formed on the semiconductor substrate 1. The memory cell transistors 43 are each made of a laminate composed of a gate insulating film 22 and an FG electrode 23. The individual memory cell transistors 43 are separated from each other through an element isolation trench 26 made in the semiconductor substrate 1. An element isolation insulating film 37 is buried in the element isolation trench 26. An IPD film 5 is formed to cover the upper surfaces of the memory cell transistors 43 and the upper surface of the element isolation insulating film 37. CG electrodes 42 are formed thereon.

As illustrated in the part (b) of FIG. 7, the IPD film 5 specifically has a laminated structure composed of a silicon nitride film 71, a silicon oxide film 72, a silicon nitride film 73, a silicon oxide film 74 and a silicon nitride film 75 (NONON film). The IPD film 5 has, at respective interfaces thereof, aluminum-atom-containing films 81, 82, 83 and 84. It is preferred that in the interface between the silicon oxide film 72 and each of the aluminum-atom-containing films 81 and 82, the silicon-oxide-film-contacting surface of the aluminum-atom-containing film is in a state of being higher in oxygen density than the silicon oxide film 72; the same matter is applied to the film 74 and the films 83 and 84.

Accordingly, in the same manner as in the first embodiment, instead of the aluminum-atom-containing films 81, 82, 83 and 84, use may be made of films each containing atoms that is other than the aluminum atoms and do not easily generate oxygen deficiency by an appropriate treatment. Examples of the atoms include non-transition metal atoms, and preferred examples thereof include boron atoms, and alkaline earth metal atoms such as beryllium, magnesium, calcium, strontium, and barium. In the same manner as in the first embodiment, the aluminum-atom-containing films 81, 82, 83 and 84 may each be in the state of a film of any one of an oxide, a nitride, a boride, a sulfide and others, or in the state of a film of a mixture of two or more thereof. Hereinafter, a description will be made, giving, as an example, a case where the aluminum-atom-containing films 81, 82, 83 and 84 are each an aluminum oxide film. In the same manner as in the first embodiment, the concentration of aluminum atoms or different-species atoms in each of the aluminum-atom-containing films 81, 82, 83 and 84 is preferably adjusted to set the surface density thereof into the value of not less than 1e12 atoms/cm$^2$ and not more than 1e16 atoms/cm$^2$.

The description about the present embodiment has been made or will be made on the premise that the aluminum-atom-containing films 81, 82, 83 and 84 are each in the form of a film. However, the aluminum-atom-containing films 81, 82, 83 and 84 in the embodiment are each not limited into any film form. In the same way as in the first embodiment, it is allowable to use, instead of each of the film-form aluminum-atom-containing films 81, 82, 83 and 84, the following form: a form that aluminum atoms or different-species atoms are present at each of the interfaces of the IPD film 5, which is the laminated structure of the silicon nitride film 71/the silicon oxide film 72/the silicon nitride film 73/the silicon oxide film 74/the silicon nitride film 75.

The process for producing the semiconductor memory device of the embodiment is substantially different from that in the first embodiment only in that the number of steps thereof is increased from that in the first embodiment. Each of the steps is performed in the same way as in the first embodiment. Thus, detailed description thereof is omitted herein.

In the same manner as in the first embodiment, according to the present embodiment, the IPD film 5 of the laminated structure of the silicon nitride film 71/the silicon oxide film 72/the silicon nitride film 73/the silicon oxide film 74/the silicon nitride film 75 (NONON film) has, at the interfaces thereof, the aluminum oxide films 81, 82, 83 and 84, respectively, thereby restraining a deterioration in the charge-retention characteristic to make it possible to give the semiconductor memory device 31 with excellent device characteristics and reliability.

Specifically, in the semiconductor memory device 31 of the embodiment, the IPD film 5, which is the NONON film, has, at the two central interfaces thereof, the aluminum oxide films 82 and 83, respectively. These films 82 and 83 make it possible that charges are caused to remain in the silicon nitride film 73 at the center of the NONON film even at the time of the charge-retention of the semiconductor memory device 31. This matter makes it possible to restrain a charge-retention characteristic deterioration based on the detrap of the charges in the silicon nitride film 73.

Furthermore, even when a data is written into the semiconductor memory device 31, in the same manner as in the first embodiment the presence of the aluminum oxide film 83, which contacts the CG electrode 42 side of the central silicon nitride film 73, makes it possible to cause charges to remain in the silicon nitride film 73. The effect of the charges remaining in the silicon nitride film 73, as well as the presence of the aluminum oxide film 81 at the interface between the silicon nitride film 71 at the FG electrode 23 side of the device and the silicon oxide film 72, makes it difficult that charges in the FG electrode 23 are detrapped toward the CG electrode 42. Accordingly, the charges remain easily in the FG electrode 23. As a result, the data can easily be written.

In the meantime, when the data is erased in the semiconductor memory device 31, the presence of the aluminum oxide film 82, which contacts the FG electrode 23 side of the central silicon nitride film 73, makes it possible to cause charges to remain in this silicon nitride film 73 in the same manner as in the first embodiment. The attainment of the remaining of the charges in the silicon nitride film 73, as well as the presence of the aluminum oxide film 84 at the interface between the silicon nitride film 75 at the CG electrode 42 side of the device and the silicon oxide film 74, makes it possible to prevent the injection of charges from the CG electrodes 42. Accordingly, only the charges in the FG electrode 23 need merely to be erased. As a result, the charges in the FG electrode 23 can easily be erased.

In short, the embodiment makes it possible to make better the writing/erasing properties of the semiconductor memory device 31.

The above description has been made about a structure as has been illustrated in the part (b) of FIG. 7, wherein the IPD film 5 has the laminated structure composed of the silicon nitride film 71/the silicon oxide film 72/the silicon nitride film 73/the silicon oxide film 74/the silicon nitride film 75 (NONON film), and the IPD film 5 has, at the four interfaces thereof, the aluminum oxide films 81, 82, 83 and 84, respectively. However, the embodiment is not limited to this structure. Thus, the embodiment may have a structure having an aluminum oxide film at any one of the four interfaces, or aluminum oxide films at any two or three thereof, respectively. In other words, it is preferred to select, from all the interfaces, one or more where one or more aluminum oxide films are to be formed in accordance with a desired property of the semiconductor memory device 31 since the respective aluminum oxide films at all the interfaces have different advantageous effects, as has been described above.

Third Embodiment

The first and second embodiments described hereinbefore are each about a device wherein its IPD film 5 is an ONO film or NONON film. However, the invention is not limited to this case. The invention is applicable to an interface between any silicon oxide film and a silicon nitride film (adjacent thereto) in an NONO film or ONON film, wherein a silicon nitride film is formed on either one side of an ONO film, as is performed in the embodiment. As to which interface, out of the interfaces of this (NONO film or ONON) film, an aluminum oxide film is to be formed on, various selections may be made.

Figure 8:
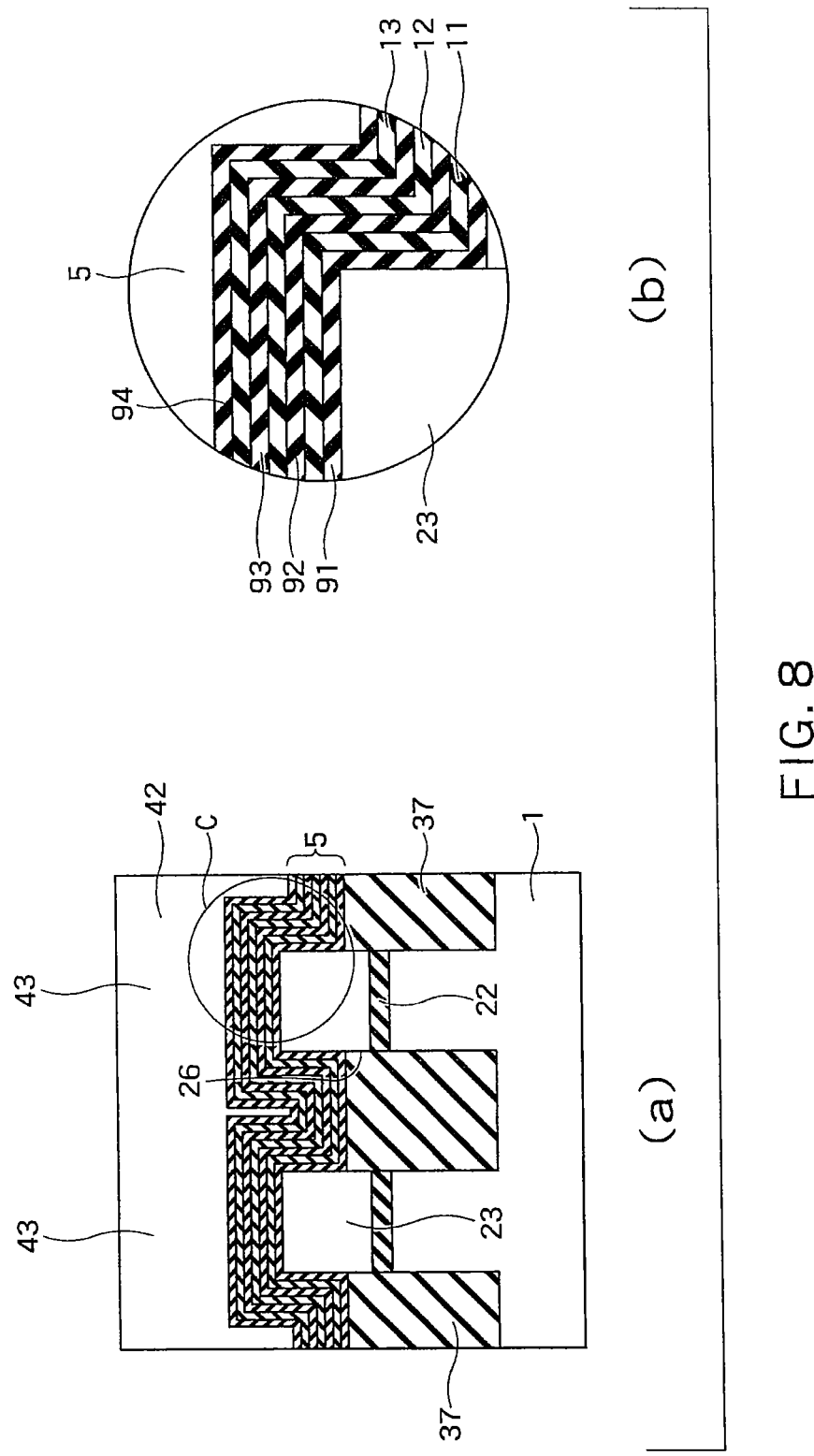
FIG. 8 is a view illustrating a cross section of the nonvolatile semiconductor memory device according to a third embodiment, and an enlarged portion thereof together.

FIG. 8 partially illustrates a semiconductor memory device 31 wherein its IPD film 5 is an NONO film. In a modified example of the embodiment, the IPD film 5 may be an ONON film, as described just above. A part (a) of FIG. 8 is specifically a sectional view of a memory cell region of the semiconductor memory device 31, which is obtained by cutting the device 31 along line A-A' line in FIG. 1. A part (b) thereof is a view obtained by enlarging a region C surrounded by a circle in the part (a).

As illustrated in the part (b) of FIG. 8, the IPD film 5 has a laminated structure composed of a silicon nitride film 91, a silicon oxide film 92, a silicon nitride film 93, and a silicon oxide film 94 (NONO film). The IPD film 5 has, at respective interfaces thereof, aluminum-atom-containing films 11, 12 and 13. It is preferred that in the interface between the silicon oxide film 92 and each of the aluminum-atom-containing films 11 and 12, the silicon-oxide-film-contacting surface of the aluminum-atom-containing film is in a state of being higher in oxygen density than the silicon oxide film 92; the same matter is applied to the film 94 and the films 12 and 13.

Accordingly, in the same manner as in the first and second embodiments, instead of the aluminum-atom-containing films 11, 12 and 13, use may be made of films each containing atoms that is other than the aluminum atoms and do not easily generate oxygen deficiency by an appropriate treatment. In the same manner as in the first and second embodiments, the aluminum-atom-containing films 11, 12 and 13 may each be in the state of a film of any one of an oxide, a nitride, a boride, a sulfide and others, or in the state of a film of a mixture of two or more thereof. In the same manner as in the first embodiment, the concentration of aluminum atoms or different-species atoms in each of the aluminum-atom-containing films 11, 12 and 13 is preferably adjusted to set the surface density thereof into the value of not less than 1e12 atoms/cm$^2$ and not more than 1e16 atoms/cm$^2$.

In the same way as in the first and second embodiments, in the present embodiment the aluminum-atom-containing films 11, 12 and 13 are each not limited to any film form. Thus, it is allowable to use the following form: a form that aluminum atoms or different-species atoms are present at each of the interfaces of the IPD film 5, which is the laminated structure of the silicon nitride film 91/the silicon oxide film 92/the silicon nitride film 93/the silicon oxide film 94.

The above description has been made about a structure such as the structure wherein the IPD film 5 has, at the three interfaces thereof, the aluminum-atom-containing films 11, 12 and 13, respectively. However, the embodiment is not limited to this structure. Thus, the embodiment may have a structure having an aluminum-atom-containing film at any one of the three interfaces, or aluminum-atom-containing films at any two thereof, respectively. In other words, it is preferred to select, from all the interfaces, the one or two surfaces in accordance with a desired property of the semiconductor memory device 31.

In the same way as in the first and second embodiments, in the present embodiment, the IPD film 5 (NONON film or ONON film) of the laminated structure has, at the interfaces thereof, the aluminum oxide films 11, 12 and 13, respectively. This matter makes it possible to restrain a charge-retention characteristic deterioration to give the semiconductor memory device 31 with excellent device characteristics and reliability.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device, comprising:
   a semiconductor substrate;
   a first insulating film formed on the semiconductor substrate;
   a charge storage film formed on the first insulating film;
   a second insulating film formed on the charge storage film; and
   a control electrode formed on the second insulating film,
   wherein the second insulating film has a laminated structure having a first silicon oxide film, a first silicon nitride film, and a second silicon oxide film,
   a first atom other than silicon is provided at an interface between the first silicon oxide film and the first silicon nitride film, and/or at an interface between the second silicon oxide film and the first silicon nitride film, the first atom being selected from the group consisting of aluminum, boron, and alkaline earth metals,
   the first atom forms an oxide film, and
   in the oxide film formed by use of the first atom, its surface contacting the first silicon oxide film or the second silicon oxide film is higher in oxygen density than the first silicon oxide film or the second silicon oxide film.

2. The nonvolatile semiconductor memory device according to claim 1, wherein the film formed by use of the first atom has a film thickness of not less than 0.001 nm and not more than 1 nm.

3. The nonvolatile semiconductor memory device according to claim 1, wherein the first atom has a concentration of not less than 1e12 atoms/cm$^2$ and not more than 1e16 atoms/cm$^2$.

4. The nonvolatile semiconductor memory device according to claim 1, wherein the second insulating film further comprises a second silicon nitride film and a third silicon nitride film that sandwich the laminated structure therebetween.

5. The nonvolatile semiconductor memory device according to claim 4, wherein
   a second atom is provided at an interface between the second silicon nitride film and the first silicon oxide film, and/or at an interface between the second silicon oxide film and the third silicon nitride film, the second atom being selected from the group consisting of aluminum, boron, and alkaline earth metals.

6. The nonvolatile semiconductor memory device according to claim 5, wherein the second atom forms one of an oxide film, a nitride film, a boride film, and a sulfide film.

7. The nonvolatile semiconductor memory device according to claim 6, wherein the film formed by use of the second atom has a film thickness of not less than 0.001 nm and not more than 1 nm.

8. The nonvolatile semiconductor memory device according to claim 6, wherein in the film formed by use of the second atom, its surface contacting the first silicon oxide film or the second silicon oxide film is higher in oxygen density than the first silicon oxide film or the second silicon oxide film.

9. The nonvolatile semiconductor memory device according to claim 5, wherein the second atom has a concentration of not less than 1e12 atoms/cm$^2$ and not more than 1e16 atoms/cm$^2$.

10. The nonvolatile semiconductor memory device according to claim 1, wherein the second insulating film further comprises a fourth silicon nitride film, and the fourth silicon nitride film contacts the laminated structure from the first silicon oxide film side or the second silicon oxide film side of the laminated structure.

11. The nonvolatile semiconductor memory device according to claim 10, wherein a third atom is provided at an interface between the fourth silicon nitride film and the first silicon oxide film, or at an interface between the second silicon oxide film and the fourth silicon nitride film, the third atom being selected from the group consisting of aluminum, boron, and alkaline earth metals.

12. The nonvolatile semiconductor memory device according to claim 11, wherein the third atom forms one of an oxide film, a nitride film, a boride film, and a sulfide film.

13. The nonvolatile semiconductor memory device according to claim 12, wherein the film formed by use of the third atom has a film thickness of not less than 0.001 nm and not more than 1 nm.

14. The nonvolatile semiconductor memory device according to claim 12, wherein in the film formed by use of the third atom, its surface contacting the first silicon oxide film or the second silicon oxide film is higher in oxygen density than the first silicon oxide film or the second silicon oxide film.

15. The nonvolatile semiconductor memory device according to claim 11, wherein the third atom has a concentration of not less than 1e12 atoms/cm$^2$ and not more than 1e16 atoms/cm$^2$.

* * * * *